United States Patent [19]

Van Aken

[11] Patent Number: 5,777,388
[45] Date of Patent: Jul. 7, 1998

[54] SEMICONDUCTOR DEVICE OF THE TYPE SEALED IN GLASS HAVING A SILVER-COPPER BONDING LAYER BETWEEN SLUGS AND CONNECTION CONDUCTORS

[75] Inventor: Timotheus J. M. Van Aken, Stadskanaal, Netherlands

[73] Assignee: U.S. Philips Corporation, New York, N.Y.

[21] Appl. No.: 615,924

[22] Filed: Mar. 14, 1996

[30] Foreign Application Priority Data

Mar. 20, 1995 [EP] European Pat. Off. ............ 95200661

[51] Int. Cl.$^6$ .......................... H01L 23/48; H01L 23/52; H01L 29/40
[52] U.S. Cl. .................... 257/742; 257/772; 257/762
[58] Field of Search ........................ 257/212, 742, 257/743, 750, 772, 762, 694, 763

[56] References Cited

U.S. PATENT DOCUMENTS

| | | |
|---|---|---|
| 3,331,996 | 7/1967 | Green ............................ 257/763 |
| 3,844,029 | 10/1974 | Dibugnara ...................... 257/750 |
| 4,017,266 | 4/1977 | Golberg et al. . |
| 4,242,134 | 12/1980 | D'Silva . |
| 4,358,784 | 11/1982 | Wislocky et al. ............. 257/741 |
| 4,416,853 | 11/1983 | Morikawa et al. . |
| 4,444,719 | 4/1984 | Sakakibara et al. .......... 420/511 |
| 4,448,853 | 5/1984 | Fischer et al. . |
| 4,621,761 | 11/1986 | Hammond et al. . |
| 4,971,758 | 11/1990 | Suzuki et al. ............... 420/472 |
| 5,008,735 | 4/1991 | Edmond et al. ............. 257/730 |

FOREIGN PATENT DOCUMENTS

| | | |
|---|---|---|
| 53-112239 | 3/1980 | Japan ................ H01L 21/302 |
| 63-254965 | 10/1988 | Japan . |
| 1115356 | 5/1968 | United Kingdom . |
| 2033425 | 5/1980 | United Kingdom . |

OTHER PUBLICATIONS

Patent Abstracts of Japan, vol. 4, No. 71, JP.A.55-39617 "Manufacturing of Glass Mold Type Diode", Mar. 19, 1980.

Primary Examiner—Sara W. Crane
Assistant Examiner—Phat X. Cao
Attorney, Agent, or Firm—Brian J. Wieghaus

[57] ABSTRACT

The invention relates to a semiconductor device of the type sealed in glass, comprising a semiconductor body having a pn-junction between opposing faces which are connected to slugs of a transition metal, said slugs being connected to copper-containing connection conductors by a bonding layer, the bonding layer comprising, in addition to copper and silver, more than 1 wt. % germanium.

11 Claims, 1 Drawing Sheet

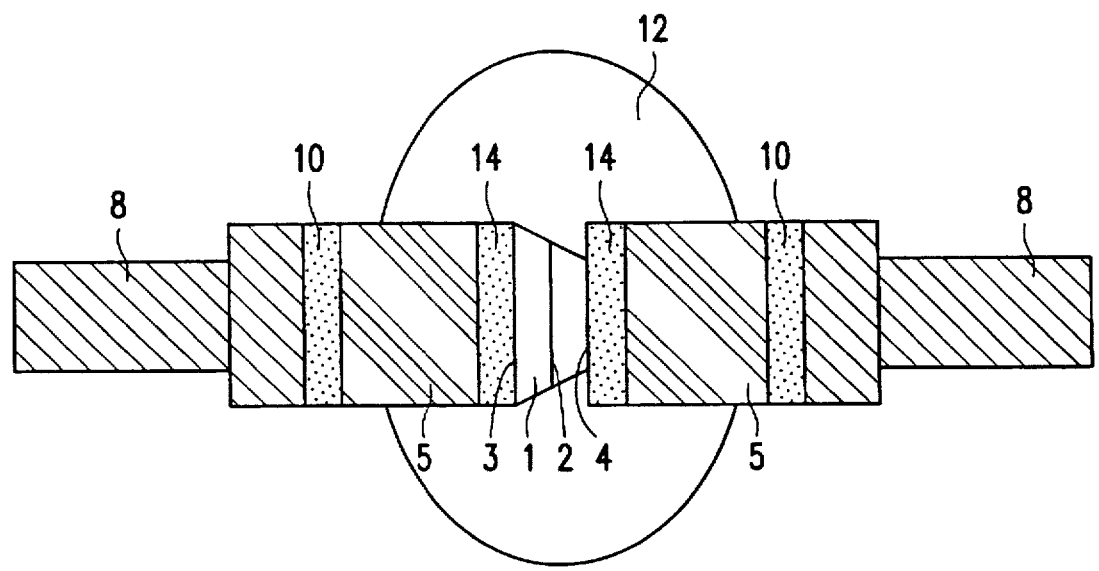

SEMICONDUCTOR DEVICE OF THE TYPE SEALED IN GLASS HAVING A SILVER-COPPER BONDING LAYER BETWEEN SLUGS AND CONNECTION CONDUCTORS

BACKGROUND OF THE INVENTION

The invention relates to a semiconductor device of the type sealed in glass, comprising a semiconductor body having a pn-junction between opposing faces which are connected to slugs of a transition metal, said slugs being connected to copper-containing connection conductors by means of a silver- and copper-containing bonding layer, at least the semiconductor body and a part of the slugs being covered with the glass.

Such a device, which is also referred to as glass-bead diode, is particularly suitable for applications in which a very good passivation, a hermetic sealing of the semiconductor body, mechanical strength or resistance against high temperatures are important factors. The glass passivates the semiconductor body and forms a barrier against moisture. Apart from the semiconductor body, the glass also covers the part of the slugs adjacent to said semiconductor body. In such a device, the slugs of a transition metal, the glass and the semiconductor body have coefficients of thermal expansion which are of the same order of magnitude to preclude defects caused by thermal expansion. The connection conductors serve to enable the semiconductor device to be electrically connected, for example, to a printed circuit board. Such a device is made by soldering the semiconductor body to the slugs and the slugs to the connection conductors at a relatively high temperature by means of a so-called "brazing process", that is, a soldering process at a relatively high temperature (above approximately 450° C.). Subsequently, the glass is provided at a temperature which is lower than that of the soldering process.

A device of the type mentioned in the opening paragraph is known from the abstract in the English language of Japanese Patent Application JP-A-55-39617 in which a silver-copper solder is used to connect molybdenum slugs to copper connection conductors in the form of connection wires.

Said known device has the drawback that the tensile strength of the connection between the slugs and the connection wires is insufficient.

SUMMARY OF THE INVENTION

It is an object of the invention, inter alia, to obviate said disadvantage.

To this end, the device in accordance with the invention is characterized in that, in addition to copper and silver, the bonding layer comprises more than 1 wt. % germanium.

This results in a sufficiently great tensile-strength of the bonding layer. In practice it is found, for example in the case of copper conductors, that pulling the connection conductors causes them to break, whereas the bonding layer remains intact.

Preferably, the device in accordance with the invention is characterized in that the bonding layer comprises less than 5 wt. % germanium. If the germanium content exceeds 5 wt. %, the bonding layer is relatively hard and brittle, so that in practice said bonding layer is relatively difficult to apply.

An additional advantage is obtained if the bonding layer comprises between 20 and 30 wt. % copper. In practice, such a bonding layer has a relatively low melting point in the range between approximately 780° and 800° C.

If the slugs and the connection conductors are soldered together at an elevated temperature for a relatively long period of time, and if use is made of connection conductors comprising almost exclusively copper, problems regarding the strength of the bonding layer may occur in the manufacturing process. Preferably, the connection conductors comprise, in addition to copper, a metal from the group formed by iron, cobalt and nickel. It has been found that in the case of connection conductors comprising iron, cobalt or nickel, problems regarding the strength of the bonding layer do not occur, even if the soldering process is carried out at an elevated temperature for a long period of time. It is assumed that in the case of connection conductors comprising almost exclusively copper, germanium of the bonding layer diffuses into the copper connection conductors during soldering at an elevated temperature, so that the quantity of germanium in the bonding layer decreases to a level which, in the case of long soldering times at an elevated temperature, yields a bonding layer whose strength is insufficient. It is assumed that the iron, cobalt or nickel in the connection conductors largely precludes diffusion of germanium into the connection conductor, so that the quantity of germanium in the bonding layer remains large enough to yield a strong bonding layer. The semiconductor device preferably has connection conductors which comprise a core containing iron and, around said core, a sheath containing copper. Such a connection conductor has proved to be very satisfactory in practice.

Preferably, the bonding layer also comprises less than 1 wt. % of a metal from the group formed by iron, nickel or cobalt. Such a metal causes the adhesion of the bonding layer to the transition metal to improve. It is a so-called "nucleation element", which ensures that sufficient germanium is present at the interface between transition metal and bonding layer.

These and other aspects of the invention will be apparent from and elucidated with reference to the embodiments described hereinafter.

BRIEF DESCRIPTION OF THE DRAWINGS

In the drawings:

The sole FIGURE shows a glass-bead diode.

The FIGURE is purely schematic and not drawn to scale.

DETAILED DESCRIPTION OF THE PREFERRED EMBODIMENTS

The FIGURE shows a glass-bead-diode semiconductor device of the type sealed in glass, comprising a semiconductor body 1 having a pn-junction 2 between opposing faces 3, 4, which are connected to slugs 5 of a transition metal, said slugs 5 being connected to copper-containing connection conductors 8 by means of a silver- and copper-containing bonding layer 10, at least the semiconductor body 1 and a part of the slugs 5 being covered with the glass 12. The slugs are composed of metals such as tungsten or molybdenum. Alternatively, use is made of combinations of metals, for example, from the group formed by iron, nickel and copper, which combinations are also known by names such as dumet, fernico or invar. In practice, use is preferably made of molybdenum slugs 5. Said slugs 5 are connected to the semiconductor body 1 by means of a bonding layer 14.

Such a device is manufactured by providing a titanium layer, silver layer and aluminium layer in thicknesses of 0.2 μm, 3.65 μm and 2.4 μm, respectively, on the semiconductor body, for example, by means of vapor deposition. After the soldering operation, the silver and aluminium layers form a bonding layer 14 of Ag89Al11, the numbers representing percentages by weight. Subsequently, parts of the glass-bead diode, such as the connection wires 8, the slugs 5 and the semiconductor body 1, are positioned relative to each other as shown in the FIGURE. At the location of the bonding layer 10, plates are provided which are made from the material of said bonding layer 10. Such plates are manufactured by means of known standard techniques, for example, by melting the metals of the bonding layer 10 in the desired ratio and by means of techniques such as rolling and blanking. After the parts have been positioned, they are brought to a temperature of approximately 830° C. The semiconductor body 1 is then soldered to the slugs 5 by means of the bonding layer 14, and said slugs 5 are soldered to the connection wires 8 by means of the bonding layer 10, so that a soldered structure is formed. For the manufacture of glass-bead diodes, preferably, temperatures below approximately 830° C. and soldering times below 20 minutes are observed, because at higher temperatures and longer soldering times material of the bonding layers 10, 14 diffuses away and the properties of the bonding layers undergo a change. After the soldering process, the soldered structure is cleaned by means of so-called lye etching in an alkaline solution of NaOH (40 g/l) to allow the glass 12 to adhere well to the structure. After said cleaning step, a glass suspension, for example, of lead-borate glass or zinc-borate glass, also referred to as Schott glass or Ferro glass, is provided on the structure thus formed. The glass suspension is sintered at a lower temperature, in this example a temperature ranging between 700° and 730° C., than the temperature used during soldering. The glass 12 covers the semiconductor body 1 and at least a part of the slugs 5 (see FIGURE).

In practice, the diameter of the slugs 5 and the bonding layer 10 is approximately 50% larger than the diameter of the connection wires. For example, use is made of a connection wire having a diameter of 1.322 and a section at the location of the bonding layer of 2.0 mm. Materials which are customarily used to solder copper-containing wires to slugs of a transition metal are AgCu28 having a melting temperature of 780° C. and AgCu26.6Pd5 having a melting temperature of 820° C., the numbers representing percentages by weight. If, for example, AgCu28 is used as the bonding layer 10, pulling the connection wires causes the connection between the slugs 5 and the connection wires to be broken in the silver-copper bonding layer 10 in all cases, in spite of the fact that the bonding layer 10 has a larger diameter than the connection wires. In the case of AgCu26.6Pd5 breakage in the bonding layer 10 occurs in approximately ten percent of the cases.

In accordance with the invention, the bonding layer 10 comprises, in addition to copper and silver, more than 1 wt. % germanium. This results in a much greater tensile strength of the bonding layer 10. The bonding layer 10 preferably comprises between 20 and 30 wt. % copper. Experiments in which use is made of a bonding layer 10 of AgCu28 having a germanium content of 2, 3 and 5 wt. %, and molybdenum slugs 5 and copper connection wires 8 show that pulling the connection wires causes them to break, whereas the bonding layer 10 remains intact. The soldering temperature at which the bonding layer 10 is provided is not very critical. For example, such a bonding layer 10 can be provided at a soldering temperature in the range between, for example, 795° and 900° C., without the properties of the bonding layer being adversely affected. Moreover, the slugs 5 and the connection wires are moistened very satisfactorily by the bonding layer 10 in the manufacturing process.

The bonding layer 10 preferably comprises less than 5 wt. % germanium. If the germanium content exceeds 5 wt. %, the bonding layer 10 has a great tensile strength but the plates consisting of the material of the bonding layer, which are used for soldering, are very difficult to manufacture.

If the slugs 5 and the connection wires are soldered together at an elevated temperature for a relatively long period of time, and if connection conductors 8, which comprise almost exclusively copper, are used, problems regarding the strength of the bonding layer 10 may occur in the manufacturing process. Preferably, the connection conductors 8 comprise, in addition to copper, iron, cobalt or nickel. It has been found that in the case of connection conductors 8 which comprise iron, cobalt or nickel, problems regarding the strength of the bonding layer 10 do not occur, even if the soldering process is carried out at an elevated temperature for a long period of time. Preferably, use is made of a connection wire 8 having a core of iron, for example Low Carbon (LC) or Interstitional Free (IF) iron, which is provided with a copper sheath. A connection wire 8 having, for example, an iron core of 0.8 mm and a copper sheath having a thickness of 0.26 mm proves to be very satisfactory. Such a connection wire is also known by the name Fecuma wire with a 70% IACS (International Accepted Conductivity Standard).

Preferably, the bonding layer 10 also comprises less than 1 wt. % of a metal from the group formed by iron, nickel or cobalt. Such a metal allows a better adhesion of the bonding layer 10 to the transition metal to be achieved. Said metal is a so-called "nucleation element" which ensures that sufficient germanium is present at the interface between the transition metal and the bonding layer 10. For example, AgCu282Fe0.2, AgCu28GeCo0.3, AgCu28Ge2Ni0.1 can be used as the material for the bonding layer, the numbers representing percentages by weight. Bonding layers comprising iron or cobalt are better moisturizers of slugs of transition metals than bonding layers comprising nickel, whereas nickel or cobalt-containing bonding layers have a greater strength than iron-containing bonding layers. Preferably, use is made of a bonding layer of AgCu28Ge2Co0.3, because this layer combines satisfactory moistening properties with a great strength.

The invention is not limited to the above-described exemplary embodiments. For example, in the exemplary embodiments the semiconductor body 1 is a diode provided with one pn-junction 2 between opposing faces 3, 4. It is alternatively possible, however, that the semiconductor body 1 comprises a number of series-arranged pn-junctions 2. The semiconductor body 1 shown in the FIGURE then comprises a number of interconnected semiconductor bodies which each include a pn-junction 2. The semiconductor device can then suitably be used to rectify relatively high voltages. In the foregoing, a specific technique for the manufacture of the bonding layer 10 is mentioned. However, this is not to be understood to mean that the device in accordance with the invention can only be manufactured by means of such a technique. For example, instead of the plates used in the example, layers of the desired composition can be provided on the slugs or on the connection conductors by means of electrodeposition, "chemical vapor deposition" (CVD) or vapor-deposition techniques. The bonding layer can alternatively be provided by means of a paste. The glass 12 can also be provided in a manner which differs from the one described herein, for example by providing a glass tube around the semiconductor body and the slugs and melting said glass tube. In the example, connection wires are used as connection conductors. Said connection conductors may very well have a different shape, for example a cylindrical or rectangular box shape to enable, for example, surface mounting in accordance with a so-called "surface mounting" technique (SMD).

What is claimed is:

1. A semiconductor device, comprising a semiconductor body having a pn-junction between opposing faces, a slug of a transition metal, a copper-containing connection conductor and a bonding layer, said semiconductor body being coupled to said slug, said slug being connected to said copper-containing connection conductor by said bonding layer, and said bonding layer containing silver as a largest constituent in wt. %, copper as a second largest constituent in wt. %, more than 1 wt. % and less than 5 wt. % germanium, and more than 0 wt. % and less than 1 wt. % of cobalt.

2. The semiconductor device as claimed in claim 1, wherein the bonding layer comprises copper of a quantity in the range of approximately 20 to 30 wt. %.

3. The semiconductor device of claim 1, wherein the bonding layer comprises AgCu28Ge2Co0.3, the numbers representing percentages by weight.

4. The semiconductor device as claimed in claim 1, wherein the connection conductor comprises a core containing iron and, around said core, a sheath containing copper.

5. The semiconductor device of claim 4, wherein the core has a diameter of approximately 0.8 mm and the sheath has a thickness of approximately 0.26 mm.

6. A semiconductor device, comprising a semiconductor body having a pn-junction between opposing faces, a slug of a transition metal, a copper-containing connection conductor and a bonding layer, said semiconductor body being coupled to said slug, said slug being connected to said copper-containing connection conductor by said bonding layer, and said bonding layer consisting essentially of silver, copper, germanium and iron, more than 1 wt. % and less than 5 wt. % of said bonding layer being germanium and less than 1 wt. % of said bonding layer being iron.

7. The semiconductor device of claim 6, wherein the bonding layer comprises AgCu28Ge2Fe0.2, the numbers representing percentages by weight.

8. The semiconductor device as claimed in claim 6, wherein the bonding layer comprises copper of a quantity in the range of approximately 20 to 30 wt. %.

9. The semiconductor device as claimed in claim 6, wherein the connection conductor comprises a metal from the group formed by iron, cobalt and nickel.

10. The semiconductor device as claimed in claim 6, wherein the connection conductor comprises a core containing iron and, around said core, a sheath containing copper.

11. The semiconductor device of claim 10, wherein the core has a diameter of approximately 0.8 mm and the sheath has a thickness of approximately 0.26 mm.

* * * * *